(12) United States Patent
Funamoto

(10) Patent No.: US 7,103,702 B2
(45) Date of Patent: Sep. 5, 2006

(54) MEMORY DEVICE

(75) Inventor: Kenji Funamoto, Asaka (JP)

(73) Assignee: Fuji Photo Film Co., LTD, Minami-Ashigara (JP)

( * ) Notice: Subject to any disclaimer, the term of this patent is extended or adjusted under 35 U.S.C. 154(b) by 216 days.

(21) Appl. No.: 10/765,956

(22) Filed: Jan. 29, 2004

(65) Prior Publication Data
US 2004/0184306 A1    Sep. 23, 2004

(30) Foreign Application Priority Data
Jan. 30, 2003   (JP)   ............... 2003-021381

(51) Int. Cl.
G06F 13/40 (2006.01)
G06F 3/00 (2006.01)
G06F 13/12 (2006.01)
G06F 15/16 (2006.01)
G09G 5/399 (2006.01)
G06F 13/20 (2006.01)

(52) U.S. Cl. .................. 710/307; 710/53; 710/66; 345/539

(58) Field of Classification Search .............. 345/539
See application file for complete search history.

(56) References Cited

U.S. PATENT DOCUMENTS

| | | | |
|---|---|---|---|
| 5,280,598 A * | 1/1994 | Osaki et al. ............. 710/310 |
| 5,513,301 A * | 4/1996 | Wakasu .................. 358/1.15 |
| 5,594,877 A * | 1/1997 | Lentz et al. ............. 710/307 |
| 5,625,386 A * | 4/1997 | Howard et al. .......... 345/540 |
| 5,630,099 A * | 5/1997 | MacDonald et al. ..... 711/172 |
| 5,802,399 A * | 9/1998 | Yumoto et al. ........... 710/66 |
| 5,886,701 A * | 3/1999 | Chauvin et al. .......... 345/418 |
| 5,887,148 A * | 3/1999 | Lentz et al. ............. 710/307 |
| 5,929,868 A * | 7/1999 | Howard et al. .......... 345/545 |
| 5,933,154 A * | 8/1999 | Howard et al. .......... 345/540 |
| 5,974,493 A * | 10/1999 | Okumura et al. ........ 710/307 |
| 6,047,348 A * | 4/2000 | Lentz et al. ............. 710/307 |
| 6,065,084 A * | 5/2000 | Chatzigianis et al. ... 710/307 |
| 6,157,973 A * | 12/2000 | Ohtani et al. ............ 710/100 |
| 6,384,832 B1 * | 5/2002 | Muramatsu et al. ..... 345/505 |
| 6,442,676 B1 * | 8/2002 | Guenthner .............. 712/210 |
| 6,697,921 B1 * | 2/2004 | Aoki ..................... 711/154 |
| 6,735,661 B1 * | 5/2004 | Gelke et al. ............ 710/307 |
| 6,742,087 B1 * | 5/2004 | Hayakawa et al. ...... 711/148 |
| 6,894,692 B1 * | 5/2005 | Schinnerer ............. 345/539 |
| 2002/0011607 A1 * | 1/2002 | Gelke et al. ............ 257/200 |
| 2002/0013874 A1 * | 1/2002 | Gelke et al. ............ 710/305 |
| 2002/0144059 A1 * | 10/2002 | Kendall .................. 711/118 |

FOREIGN PATENT DOCUMENTS

JP   11-250228   9/1999

* cited by examiner

Primary Examiner—Paul R. Myers
Assistant Examiner—Ryan Stiglic
(74) Attorney, Agent, or Firm—McGinn IP Law Group, PLLC

(57) ABSTRACT

A memory device is so adapted that data processing time is not prolonged even when there is little bus width. A DRAM is connected to first to third buffer circuits by buses, which have a bus width of 128 bits, via a selector. The first to third buffer circuits are connected to a circuit such as a signal processing circuit by buses having a bit width of 32 bits. Since part of the circuitry is connected by buses having a bit width of 32 bits, the wiring is simple. By executing various processing in parallel, it is possible to prevent prolongation of the time required to record image data on a memory card.

18 Claims, 3 Drawing Sheets

MEMORY DEVICE

BACKGROUND OF THE INVENTION

1. Field of the Invention

This invention relates to a memory device.

2. Description of the Related Art

In order to shorten write time for writing data to a memory and read-out time for reading data out of the memory, it will suffice to enlarge the bus width of the data bus connected to the memory. Enlarging the bus width, however, may result in more complicated wiring.

Data processing time may be shortened by accessing a memory more efficiently, as disclosed in, e.g., the specification of Japanese Patent Application No. 10-53083. However, such processing is comparatively complicated.

DISCLOSURE OF THE INVENTION

Accordingly, an object of the present invention is to shorten data processing time.

According to the present invention, the foregoing object is attained by providing a memory device comprising a data memory to and from which data is input and output via a data bus for a data memory; and a plurality of buffer circuits for inputting and outputting data to and from the data memory via a first data bus that has a bus width the same as that of the data bus for the data memory and that is electrically connected to the data bus for the data memory, and inputting and outputting data to and from a data processing circuit via a second data bus having a bus width smaller than that of the data bus for the data memory.

In accordance with the present invention, a plurality of buffer circuits are connected to a data memory. A plurality of processes can be executed in parallel by inputting and outputting data between the plurality of buffer circuits and the data processing circuit.

The plurality of buffer circuits and the data memory are connected by a data bus for the data memory (this bus and the first data bus may be a common bus). Thus the input and output of data can be performed at a speed decided by the bus width of the data bus for the data memory. Wiring is comparatively simple because data input/output is performed between the plurality of buffer circuits and the data processing circuit using the second data bus, which has a bus width smaller than that of data bus for the data memory.

The memory device may be further provided with a selector, which is connected between the plurality of buffer circuits and the data memory, for allowing input/output of data between any one of the plurality of buffer circuits and the data memory.

By way of example, the bus width of the second data bus is a fraction of that of the bus for the data memory.

In a case where the data input and output between the data memory and the plurality of buffer circuits is image data, an arbitration circuit may be further provided for controlling the plurality of buffer circuits in such a manner that image data representing images of different frames is input and output to and from different buffer circuits in a common time period. Thus, image data processing of different images can be executed simultaneously.

Other features and advantages of the present invention will be apparent from the following description taken in conjunction with the accompanying drawings, in which like reference characters designate the same or similar parts throughout the figures thereof.

DESCRIPTION OF THE PREFERRED EMBODIMENT

A preferred embodiment of the present invention will now be described with reference to the drawings.

Figure 1:
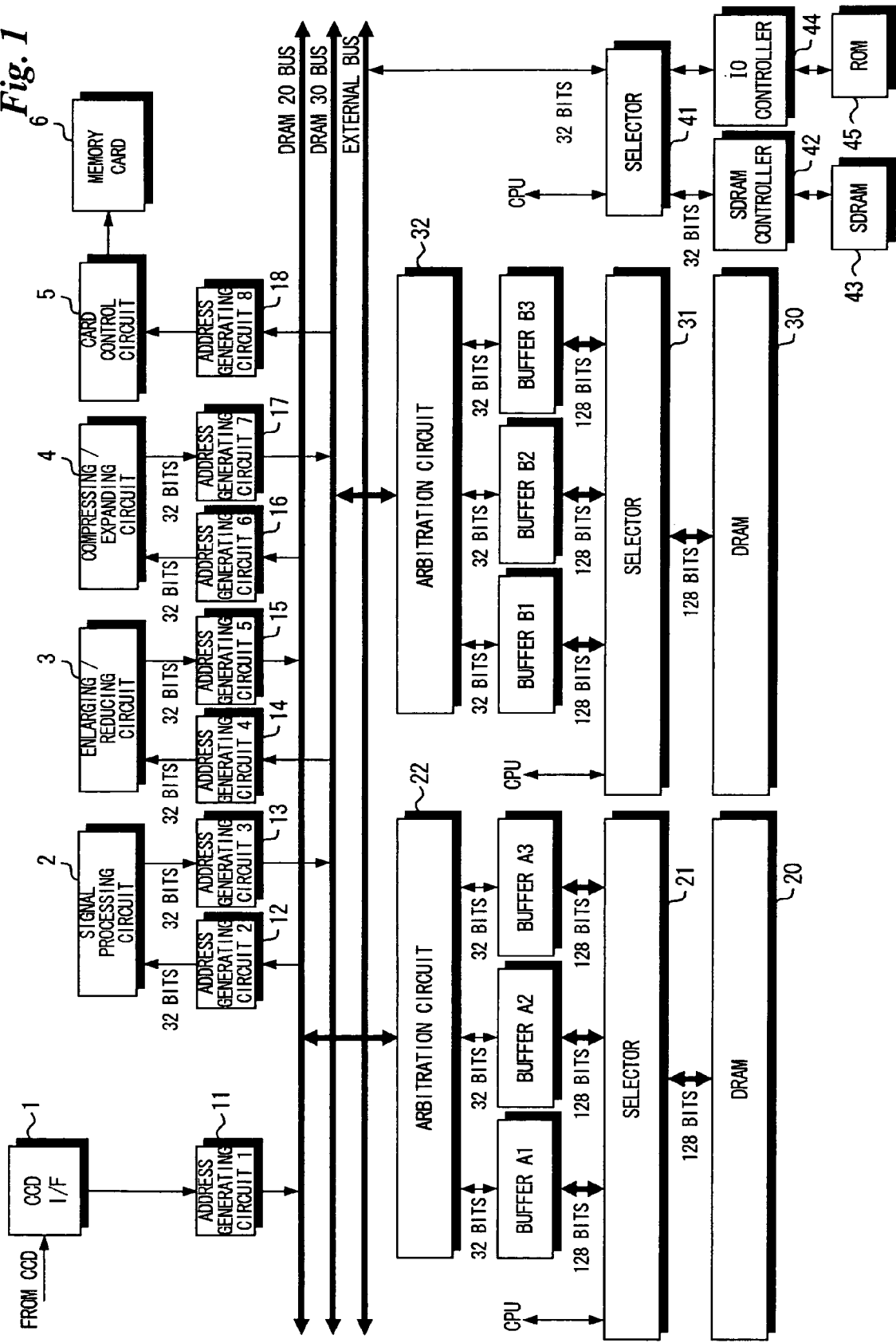
FIG. 1 is a block diagram illustrating part of the electrical structure of a digital still camera.

FIG. 1, which illustrates a preferred embodiment of the present invention, is a block diagram showing part of the electrical structure of a digital still camera.

The digital still camera includes a first DRAM (dynamic random-access memory) 20 and a second DRAM 30 for storing image data temporarily. A first buffer circuit A1, second buffer circuit A2 and third buffer circuit A3, each of which stores image data temporarily, are connected to the first DRAM 20 via a selector 21 by means of buses (a data bus for a data memory and a first data bus). A first arbitration circuit 22 is connected to the first to third buffer circuits A1 to A3 via a bus having a bus width of 32 bits. The first arbitration circuit 22 decides to and from which of first to third buffer circuits A1 to A3 image data is to be written and read. Similarly, a first buffer circuit B1, second buffer circuit B2 and third buffer circuit B3, each of which stores image data temporarily, are connected to the second DRAM 20 via a selector 31 by means of buses. In a manner similar to that of the first arbitration circuit 22, a second arbitration circuit 32 decides to and from which of first to third buffer circuits B1 to B3 image data is to be written and read. A CPU (not shown) is connected to the selectors 21 and 31. The selectors 21 and 31 are controlled by the CPU.

The bus width of the bus connected between the first DRAM 20 and first selector 21 is 128 bits. Similarly, the bus width of the buses connected between the first selector 21 and the first buffer circuit A1, second buffer circuit A2 and third buffer circuit A3 also is 128 bits. Accordingly, the transfer rate of image data between the first DRAM 20 and the first buffer circuit A1, second buffer circuit A2 and third buffer circuit A3 is based upon the bus width of 128 bits.

By contrast, the bus (second data bus) width of the buses connected between the first arbitration circuit 22 and the first to third buffer circuits A1 to A3 is 32 bits. Accordingly, the transfer rate of image data between the first arbitration circuit 22 and the first to third buffer circuits A1 to A3 is based upon the bus width of 32 bits.

The buses between the first DRAM 20 and the first to third buffer circuits A1 to A3 have a bus width of 128 bits, and the buses between the first to third buffer circuits A1 to A3 and the first arbitration circuit 22 have a bus width of 32 bits. For this reason, the time required to write and read image data to and from the first DRAM 20 (i.e., to write image data, which has been read out of the first DRAM 20, to the first to third buffer circuits A1 to A3 and to write image data from the first to third buffer circuits A1 to A3 to the first DRAM 20) is one-fourth of the time required to write data from the first arbitration circuit 22 to the first to third buffer circuits A1 to A3 and to read data out of the first to third buffer circuits A1 to A3 to the first arbitration circuit 22.

Similarly, the time required to write and read image data between the second DRAM 30 and the first to third buffer circuits B1 to B3 is one-fourth the time required to write and read image data between the second arbitration circuit 32 and the first to third buffer circuits B1 to B3.

The digital still camera includes a bus for the first DRAM 20, a bus for the second DRAM 30 and an external bus (each of these buses has a bus width of 32 bits). The bus for the first DRAM 20 is connected to the first arbitration circuit 22. The bus for the second DRAM 30 is connected to the second arbitration circuit 32. An SDRAM (synchronous dynamic random-access memory) controller 42 and an I/O (input/output) controller 44 are connected to a third selector 41. An SDRAM 43 for temporarily storing image data is connected to the SDRAM controller 42, and a ROM 45 in which prescribed data such as a program has been stored is connected to the I/O controller 44.

The digital still camera includes first to eighth address generating circuits 11 to 18. The address generating circuits 11 to 18 generate addresses of a destination at which entered image data is to be stored. The first, second, fifth and sixth address generating circuits 11, 12, 15 and 16, respectively, are connected to the bus for the first DRAM 20. The third, fourth, seventh and eighth address generating circuits 13, 14, 17 and 18, respectively, are connected to the bus for the second DRAM 30.

The digital still camera includes a CCD interface 1 for inputting image data that has been output from a CCD (not shown). The first address generating circuit 11 is connected to the CCD interface 1. Accordingly, image data that has been output from the CCD can be written to the first DRAM 20 via the bus for the first DRAM 20.

Image data that has been output from the second address generating circuit 12 is input to a signal processing circuit (data processing circuit) 2 that generates luminance data Y and color difference data C. The luminance data Y and color difference data C generated by the signal processing circuit 2 is applied to the bus for the second DRAM 30 via the third address generating circuit 13.

Image data that has been output from the fourth address generating circuit 14 is input to an enlarging/reducing circuit (data processing circuit) 3 for resizing the image represented by the image data. The image data that has been resized by the enlarging/reducing circuit 3 is applied to the bus for the first DRAM 20 via the fifth address generating circuit 15.

Image data that has been output from the sixth address generating circuit 16 is compressed or expanded by a compressing/expanding circuit (data processing circuit) 4. The compressed or expanded image data is applied to the bus for the second DRAM 30.

Image data that has been output from the eighth address generating circuit 18 is applied to a card control circuit (data processing circuit) 5. The latter writes the entered image data to a memory card 6.

The buses between the first DRAM 20 and the first to third buffer circuits A1 to A3 and the buses between the second DRAM 30 and the first to third buffer circuits B1 to B3 have a bus width of 128 bits, and the other buses have a bus width of 32 bits. Since the proportion of buses having the comparatively large bus width of 128 bits is small, handling the buses, such as connecting the buses, is comparatively easy. Even though buses of small bus width are used, various processing such as signal processing, enlargement/reduction processing and compression/expansion processing can be executed simultaneously. As a result, it is possible to prevent prolongation of processing time.

Figure 2:
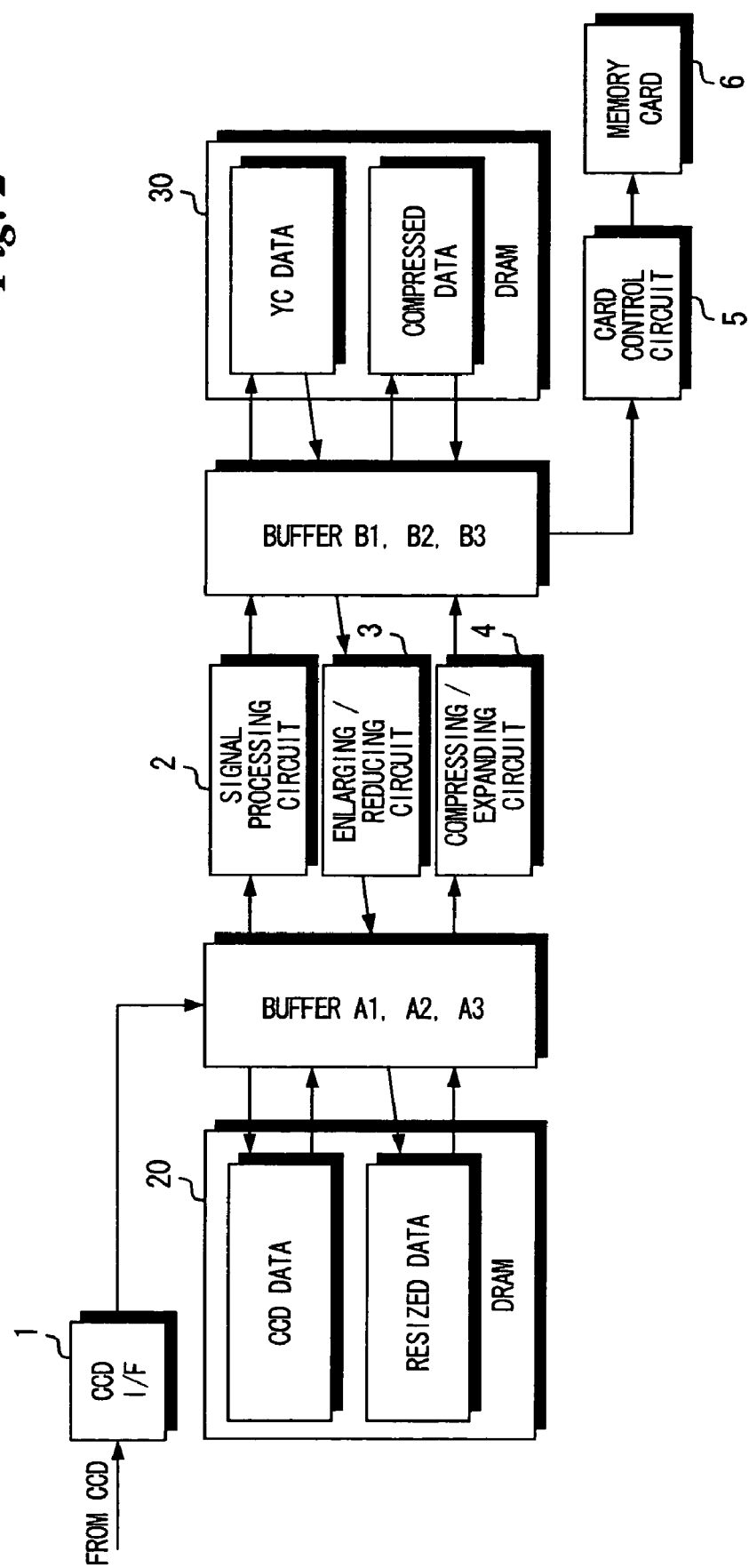
FIG. 2 is a block diagram illustrating part of the electrical structure of the digital still camera, where the emphasis is on the flow of image data.

FIG. 2 is a block diagram illustrating the electrical structure of the digital still camera according to this embodiment. This diagram focuses upon the flow of image data in the camera. Components identical with those shown in FIG. 1 are designated by like reference characters.

As mentioned above, image data that has been output from the CCD is input to the CCD interface 1. Image data that has been output from the CCD interface 1 is stored temporarily in whichever of the first to third buffer circuits A1 to A3 is capable of having image data written thereto (whichever is a vacant area). Image data is read out of any of the buffer circuits of the first to third buffer circuits A1 to A3 and is written to the first DRAM 20 (this data shall be referred to as "CCD data"). The CCD data is read out of the first DRAM 20 and is written to any of the first to third buffer circuits A1 to A3 again.

Image data that has been written to any of the buffer circuits again is applied to the signal processing circuit 2, which proceeds to generate luminance data Y and color difference data C (these items of data shall be referred to as "YC data"). The generated YC data is written to any one of the first to third buffer circuits B1 to B3. YC data that has been written to the buffer circuit is read out and written to the second DRAM 30.

Thenceforth, and in similar fashion, the writing and reading of YC data to and from any of the buffer circuits among the first to third buffer circuits B1 to B3 is carried out, resize processing is applied in the enlarging/reducing circuit 3 and resized data is obtained. The resized data is written and read to and from any of the buffer circuits among the first to third buffer circuits A1 to A3 and is written to the first DRAM 20.

The writing and reading of resized data to and from any of the buffer circuits among the first to third buffer circuits A1 to A3 is carried out and input to the compressing/expanding circuit 4. The latter applies data compression processing and obtains compressed data. The compressed data is written and read to and from any of the buffer circuits of the first to third buffer circuits B1 to B3 and is written to the second DRAM 30. The compressed data is read out of the second DRAM 30, is written to and read from any of the buffer circuits of the first to third buffer circuits B1 to B3 and is applied to card control circuit 5. The compressed data is recorded on the memory card 6 by the card control circuit 5.

The above-described processing is executed in parallel with regard to different data. All processing can be completed at a comparatively high speed even though bus width is small.

Figure 3:
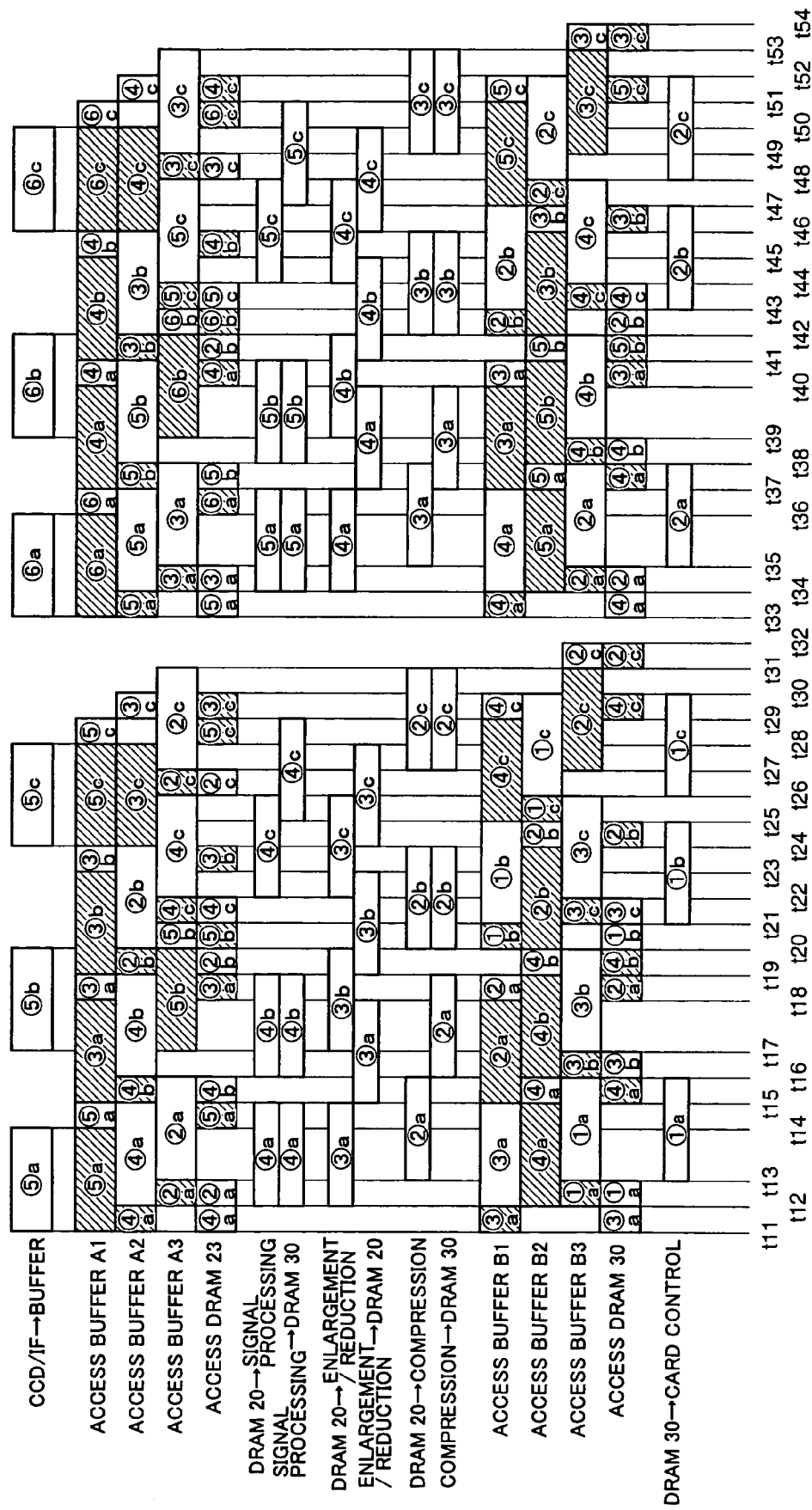
FIG. 3 is a time chart of image data.

FIG. 3 is a time chart illustrating the flow of image data. The time chart illustrates the portion of image data, from among image data representing images of a number of frames, that is recorded on the memory card (time t11 to t54). Further, as to the accessing of the buffer circuits A1 to A3, buffer circuits B1 to B3 and DRAMs 20, 30, the hatching indicates accessing that is for the purpose of writing image data to these circuits and memories.

Image data representing one frame of an image is output from the CCD. In this embodiment, however, image data representing one frame of an image is divided into three items of image data in the CCD interface 1. A data transfer is made for every item of image data obtained by such division. Image data obtained by such division will be represented below by a code comprising an encircled Arabic numeral and a letter of the alphabet. The Arabic numeral indicates the frame number of the image and the appended letter of the alphabet indicates the identification number of each of the three items of divided image data. For example, in case of image data ①a, this indicates the initial item of image data of the three items of divided image data of the image data that represents the first frame of the image. In case of image data ⑤c, this indicates the final item of image data of the three items of divided image data of the image data that represents the fifth frame of the image.

A fifth frame of image data ⑤a is output from the CCD (the first to fourth frames of image data have already been output from the CCD) and is input to the CCD interface 1. The image data ⑤a starts being output from the CCD interface 1 at time t11 and is written to any buffer circuit among the first to third buffers A1 to A3 connected to the first DRAM 20 via the selector 21. In this embodiment, image data ⑤a is written to the first buffer circuit A1 from time t11 to time t14. Image data ④a and ②a obtained previously by photography will have been written to buffer circuits other than the first buffer circuit A1, namely to the second buffer circuit A2 and third buffer circuit A3, at this time. The image data ⑤a is written to the first buffer circuit A1, which is a vacant area.

The image data ⑤a that has been written to the first buffer circuit A1 starts being read out at time t14 and is written to the first DRAM 20 by time t15 (this is CCD data). As mentioned above, the bus width of the bus through which the image data transferred from the CCD interface 1 passes is 32 bits, but the bus width of the buses between the first to third buffers A1 to A3 and the first DRAM 20 is 128 bits. Therefore, read-out time (time t14 to t15) is shorter than the write time (time t11 to t14) for writing the image data ⑤a to the first buffer circuit A1.

Similarly, when time t17 arrives, the next item of image data ⑤b of the fifth frame also is read out of the CCD interface 1 and is written to the third buffer circuit A3, which is a vacant area, at time t17. When time t20 arrives, the image data ⑤b starts being written to the first DRAM 20. It goes without saying that when the image data ⑤b is written to the first DRAM 20, the first DRAM 20 is a vacant area. The next item of image data ⑤c of the fifth frame also is handled in a similar manner.

When time t33 arrives, the image data ⑤a of the fifth frame that has been written to the first DRAM 20 is read out at a speed that is based upon the bit width of 128 bits, and this data is written to the second buffer circuit A2 by time t36. When time t34 arrives, the image data ⑤a that has been written to the second buffer circuit A2 starts being read out and is input to the signal processing circuit 2. Processing for generating the YC data is executed, in the manner described above, in the signal processing circuit 2 from time t34 to t37. The YC data ⑤a that has been generated in the signal processing circuit 2 is written successively to the second buffer circuit B2 (time t34 to t37), which is connected to the second DRAM 30. The YC data ⑤a is read out of the second buffer circuit B2 when time t37 arrives and is written to the second DRAM 30 by time t38.

Thenceforth, and in similar fashion, the image data ⑤a is written to and read from the buffer circuits A1, A2, A3, B1, B2, B3 and to the first DRAM 20 and second DRAM 30 and is recorded on the memory card 6 as compressed data.

Thus, when processing such as signal processing, enlargement/reduction processing, compression/expansion processing and processing for recording image data on the memory card 6 is being executed with regard to specific image data (image data ⑤a, etc., in this case), processing such as signal processing, enlargement/reduction processing, compression/expansion processing and record processing is executed concurrently with regard to other image data.

By way of example, from time t13 to t16, which partially overlaps time t11 to t14 during which the image data ⑤a is being written to the first buffer circuit A1, the image data ②a that has been written to the third buffer circuit A3 is read out and applied to the compressing/expanding circuit 4. The data is compressed in the compressing/expanding circuit 4 and, from time t15 to t18, is written to the first buffer circuit B1 connected to the second DRAM 30. Compressed data ②a is recorded in the second DRAM 30 from time t18 to t19.

When time t34 arrives, the compressed data ②a is read out of the second DRAM 30 and is written to the third buffer circuit B3 connected to the second DRAM 30. When time t35 arrives, the data is read out of the third buffer circuit B3 and is applied successively to the card control circuit 5. The compressed data ②a is recorded on the memory card 6 by time t38.

Since parallel processing is executed, it is possible to prevent prolongation of the time required to record image data on the memory card 6 even though bus width is small.

As many apparently widely different embodiments of the present invention can be made without departing from the spirit and scope thereof, it is to be understood that the invention is not limited to the specific embodiments thereof except as defined in the appended claims.

What is claimed is:

1. A memory device comprising:
    a data memory to and from which image data is input and output via a data bus for the data memory;
    a plurality of buffer circuits for inputting and outputting image data to and from said data memory via a first data bus that has a bus width the same as that of the data bus for said data memory and that is electrically connected to the data bus for said data memory, and inputting and outputting image data to and from a data processing circuit via a second data bus having a bus width smaller than that of the data bus for said data memory; and
    an arbitration circuit, which is connected between the data processing circuit and said plurality of buffer circuits, for controlling the plurality of buffer circuits in such a manner that image data representing images of different frames is input and output to and from different buffer circuits in a common time period.

2. The device according to claim 1, further comprising a selector, which is connected between said plurality of buffer circuits and said data memory, for allowing input/output of data between any one of said plurality of buffer circuits and said data memory.

3. The device according to claim 1, wherein the bus width of the second data bus is a fraction of that of the bus for said data memory.

4. The device according to claim 1, wherein said arbitration circuit operates the data processing circuit and said plurality of buffer circuits directly.

5. The device according to claim 1, wherein the device is devoid of structure between said arbitration circuit and the data processing circuit, and devoid of structure between said arbitration circuit and said plurality of buffer circuits.

6. The device according to claim 1, wherein a time required to write and read image data between the data memory and the plurality of buffer circuits is one-fourth of a time required to write and read image data between the plurality of buffer circuits and the arbitration circuit.

7. The device according to claim 1, further comprising:
    an address generating circuit for generating addresses of a destination at which said image data is to be stored, the address generating circuit being connected between the data processing circuit and the arbitration circuit via the second bus.

8. The device according to claim 1, further comprising:
    a plurality of address generating circuits for generating addresses of a destination at which said image data is to be stored, the plurality of address generating circuits being connected between the data processing circuit and the arbitration circuit via the second bus.

9. The device according to claim 8, wherein the plurality of address generating circuits comprise:
a first address generating circuit for inputting image data to the data processing circuit; and
a second address generating circuit for outputting output data generated from the data processing circuit to the arbitration circuit via the second bus.

10. The device according to claim 9, wherein the data processing circuit generates output data comprising luminance data and color difference data.

11. The device according to claim 9, wherein the data processing circuit generates output data comprising image enlarging/reducing data.

12. The device according to claim 9, wherein the data processing circuit generates output data comprising image compressing/expanding data.

13. The device according to claim 7, wherein the data processing circuit generates output data to be written to an external memory device.

14. The device according to claim 1, further comprising:
a charge coupled device (CCD) and from which data is output via the second data bus to the arbitration circuit and the plurality of buffer circuits.

15. The device according to claim 1, further comprising:
a selector circuit for inputting and outputting image data to and from the data memory and the plurality of buffer circuits.

16. The device according to claim 15, further comprising:
a central processor that controls the selector circuit.

17. A method for a memory device, comprising:
providing a data memory to and from which data is input and output via a data bus for the data memory;
electrically connecting a first data bus to the data bus for said data memory, wherein the first data bus width is the same as that of the data bus for said data memory;
providing a plurality of buffer circuits to and from which image data is input to and output from said data memory via the first data bus;
providing a second data bus having a bus width smaller than that of the data bus for said data memory;
providing a data processing circuit to and from which image data is input to and output from via the second data bus; and
connecting an arbitration circuit between the data processing circuit and said plurality of buffer circuits, for controlling the plurality of buffer circuits such that image data representing images of different frames is input to and output from different buffer circuits in a common time period.

18. A memory device, comprising:
means for storing data to and from which said data is input and output via a data bus for the storing means;
a plurality of input/output (I/O) means for inputting and outputting image data to and from said storing means via a first data bus that has a bus width the same as that of the data bus and that is electrically connected to the data bus for said storing means, and inputting and outputting image data to and from a data processing circuit via a second data bus having a bus width smaller than that of the data bus for said storing means; and
means, connected between the data processing circuit and said plurality of I/O means, for controlling the I/O means for inputting and outputting such that image data representing images of different frames is input and output to and from different I/O means in a common time period.

* * * * *